US012028066B2

(12) United States Patent
Lee et al.

(10) Patent No.: US 12,028,066 B2
(45) Date of Patent: Jul. 2, 2024

(54) SLEW-RATE COMPENSATED TRANSISTOR TURNOFF SYSTEM

(71) Applicant: TEXAS INSTRUMENTS INCORPORATED, Dallas, TX (US)

(72) Inventors: Kyoung Min Lee, Cary, NC (US); James M. Walden, Cary, NC (US); Brian Linehan, Cary, NC (US); Yang Zhang, Cary, NC (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/307,994

(22) Filed: Apr. 27, 2023

(65) Prior Publication Data

US 2023/0261657 A1     Aug. 17, 2023

Related U.S. Application Data

(60) Continuation of application No. 17/700,354, filed on Mar. 21, 2022, now Pat. No. 11,671,098, which is a division of application No. 17/078,329, filed on Oct. 23, 2020, now Pat. No. 11,283,448.

(60) Provisional application No. 62/926,265, filed on Oct. 25, 2019.

(51) Int. Cl.
*H03K 19/003* (2006.01)
*H03K 17/081* (2006.01)
*H03K 17/0812* (2006.01)
*H03K 17/16* (2006.01)

(52) U.S. Cl.
CPC .  *H03K 19/00384* (2013.01); *H03K 17/08104* (2013.01); *H03K 17/0812* (2013.01); *H03K 17/08122* (2013.01); *H03K 17/163* (2013.01); *H03K 17/166* (2013.01)

(58) Field of Classification Search
CPC ........... H03K 19/00384; H03K 17/166; H03K 17/163; H03K 5/12; H03K 17/08; H03K 17/08104; H03K 17/0812; H03K 17/08122
See application file for complete search history.

(56) References Cited

U.S. PATENT DOCUMENTS

| 6,201,375 | B1 | 3/2001 | Larson |
| 6,617,833 | B1 | 9/2003 | Ki |
| 2021/0223112 | A1* | 7/2021 | Tu ............................ G01K 7/01 |

* cited by examiner

*Primary Examiner* — Jung Kim
(74) *Attorney, Agent, or Firm* — Ray A. King; Frank D. Cimino

(57) ABSTRACT

In a transistor turnoff system, a transistor control circuit is configured to adjust a control voltage at a transistor control output responsive to a comparison signal at a control input. The control voltage has a slew rate. A comparator has a comparator output and first and second comparator inputs. The first comparator input is coupled to the transistor control output. The comparator is configured to: provide the comparison signal at the comparator output based on a reference voltage at the second comparator input; and deactivate the transistor control circuit by changing a state of the comparison signal responsive to the control voltage falling below the reference voltage. A slew-rate compensator is configured to increase the reference voltage by a compensation voltage that compensates for a time delay of the comparator or the transistor control circuit. The compensation voltage is proportional to the slew rate.

14 Claims, 3 Drawing Sheets

SLEW-RATE COMPENSATED TRANSISTOR TURNOFF SYSTEM

CROSS-REFERENCE TO RELATED APPLICATIONS

This application is a continuation of U.S. patent application Ser. No. 17/700,354 filed on Mar. 21, 2022 that issued on Jun. 6, 2023 as U.S. Pat. No. 11,671,098, which is a divisional of U.S. patent application Ser. No. 17/078,329 filed Oct. 23, 2020 that issued on Mar. 22, 2022 as U.S. Pat. No. 11,283,448, which claims priority to U.S. Provisional Patent Application No. 62/926,265 filed Oct. 25, 2019, which are hereby incorporated herein by reference.

TECHNICAL FIELD

This description relates generally to electronic circuits, and more particularly to a slew-rate compensated transistor turnoff system.

BACKGROUND

In many electrical systems that operate at high voltages, large transistors switch high voltage power sources to a load. Such large transistors can require a more gradual deactivation to mitigate a rapid increase in the transistor's drain or collector voltage, thereby avoiding damage to the transistor. For example, such controlled deactivation can be desired in response to a short-circuit or a desaturation event affecting the transistor. For example, by deactivating the large transistor to an approximate plateau voltage (e.g., the Miller plateau), sufficient time is provided for the discharge of parasitic capacitances affecting the transistor, thereby mitigating a rapid increase in the transistor's drain or collector voltage. As another example, the gradual deactivation of the transistor can be achieved with a programmable slew rate, in which the deactivation stops in response to the transistor's gate or base voltage falling below a reference voltage, which may be set to an approximate amplitude of the plateau voltage.

SUMMARY

A circuit includes a transistor control circuit having an input and an output adapted to be coupled to the output of the transistor control circuit and can provide a slew-rate compensation voltage proportional to a slew rate of a control voltage of the transistor. A reference voltage source can be coupled to the slew-rate compensator to provide a reference voltage at the output of the reference voltage source, the slew-rate compensator configured to add the slew-rate compensation voltage to the reference voltage to provide an adjusted reference voltage at the output of the slew rate compensator. A reference comparator having a first input, a second input and an output is coupled to the input of the transistor control circuit. The first input can be coupled to the control terminal of the transistor, and the second input can be coupled to the output of the slew-rate compensator.

In a transistor turnoff system, a transistor control circuit has a control input and a transistor control output. The transistor control circuit is configured to adjust a control voltage at the transistor control output responsive to a comparison signal at the control input. The control voltage has a slew rate. A comparator has a comparator output and first and second comparator inputs. The comparator output is coupled to the control input. The first comparator input is coupled to the transistor control output. The comparator is configured to: provide the comparison signal at the comparator output based on a reference voltage at the second comparator input; and deactivate the transistor control circuit by changing a state of the comparison signal responsive to the control voltage falling below the reference voltage. A slew-rate compensator has a compensator output coupled to the second comparator input. The slew-rate compensator is configured to increase the reference voltage by a compensation voltage that compensates for a time delay of the comparator or the transistor control circuit. The compensation voltage is proportional to the slew rate.

An integrated circuit (IC) includes a transistor turnoff circuit. The turnoff circuit includes a transistor control circuit having an input, and an output, the output adapted to be coupled to a control terminal of a transistor. A slew-rate compensator includes a first input, a second input, and an output, in which the first input is coupled to the output of the transistor control circuit. The slew-rate compensator can be configured to provide a slew-rate compensation voltage proportional to a slew rate of a control voltage of the transistor. A reference voltage source includes an output coupled to the second input of the slew rate compensator. The reference voltage source is configured to provide a reference voltage at the output of the reference voltage source. The slew-rate compensator can be configured to add the slew-rate compensation voltage to the reference voltage to provide an adjusted reference voltage at the output of the slew rate compensator. A reference comparator includes a first input, a second input, and an output, the output coupled to the input of the transistor control circuit. The first input is coupled to the first input of the slew rate compensator, and the second input is coupled to the output of the slew-rate compensator.

DETAILED DESCRIPTION

Figure 1:
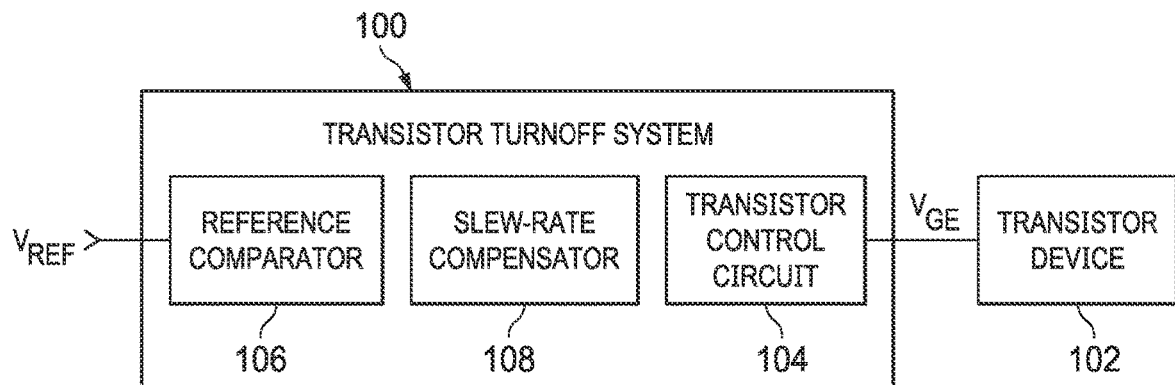
FIG. 1 illustrates an example of a transistor turnoff system.

This description relates generally to electronic circuits, and more particularly to a slew-rate compensated transistor turnoff system. For example, the slew-rate compensated transistor turnoff system can be implemented in a two-level turnoff (hereinafter "2LTO") system in a transistor gate driver. The system can be implemented for providing a controlled deactivation of a transistor (e.g., a bipolar junction transistor (BJT) or a field effect transistor (FET)), such as in a high-voltage switching application. The system includes a transistor control circuit that is activated to reduce a control voltage (e.g., base voltage for a BJT or gate voltage for an FET) in response to a deactivation event. For example, the deactivation event can include a standard deactivation of the transistor, or can include a spurious condition (e.g., a short circuit or a desaturation of the transistor) that can require a controlled deactivation of the transistor. For example, the transistor control circuit can include a current source configured to conduct a current from a control terminal (e.g., base or gate) of the transistor at a slew rate. For example, the slew rate can be programmable, such as based on the current source.

The system also includes a reference comparator configured to compare the control voltage with a predetermined reference voltage. For example, the reference voltage can be equal to a plateau voltage (e.g., the Miller plateau voltage) of the transistor. The reference comparator can be configured to generate a comparison signal provided to the current source, so the comparison signal has a first state to activate the current source and a second state to deactivate the current source. Therefore, in response to the control voltage falling below the reference voltage, the reference comparator can switch the comparison signal from the first state to the second state to deactivate the current source, and thus cease deactivation of the transistor.

The system also includes a slew-rate compensator configured to add a slew-rate adjustment voltage to the reference voltage to provide for a more accurate comparison of the reference voltage and the control voltage. For example, because the reference comparator and/or the transistor control circuit has inherent delays (e.g., of switching), deactivation of the transistor control circuit in response to the control voltage falling below the reference voltage can cause the control voltage to settle below the reference voltage (e.g., by an error voltage amplitude). Such an error voltage amplitude can cause an unacceptable increase in the drain or collector voltage upon reactivation of the transistor at a control voltage slightly below the plateau voltage. The error voltage amplitude can be based on slew rate of the decrease in the control voltage, which can be unpredictable based on a variety of factors, including the characteristics of the transistor (e.g., such as an external transistor coupled to an integrated circuit (IC) that includes the slew-rate compensated transistor turnoff system).

Accordingly, the slew-rate compensator can generate the slew-rate compensation voltage to have an amplitude proportional to the slew rate of the decrease in the control voltage. Therefore, the addition of the slew-rate compensation voltage to the reference voltage can cause the reference comparator to change the state of the comparison signal sooner to account for the inherent time delays of the reference comparator and/or the transistor control circuit. As a result, the static amplitude of the control voltage upon deactivation of the transistor control circuit can be approximately equal to the reference voltage, and thus the plateau voltage of the transistor, to mitigate a potential increase of the drain or collector voltage, and thus to mitigate damage to the transistor. As described herein, the term "approximately equal" can include some deviation from an exact value (e.g., +/−5%).

FIG. 1 illustrates an example of a slew-rate compensated transistor turnoff system 100. The transistor turnoff system 100 can be implemented in any of a variety of high-voltage switching systems to provide for a controlled deactivation of a transistor 102. For example, the transistor turnoff system 100 can be implemented in a 2LTO in a gate driver system, such as for motor controls (e.g., in an electric vehicle). As another example, the transistor turnoff system 100 can be part of an integrated circuit (IC), and the transistor 102 can be an external device electrically coupled to the transistor turnoff system 100 via external pins with respect to the IC.

The transistor turnoff system 100 includes a transistor control circuit 104 coupled to a control terminal of the transistor 102. As described herein, the term "control terminal" refers to a gate in the example of the transistor 102 being configured as a field-effect transistor (FET) or a base in the example of the transistor 102 being configured as a bipolar junction transistor (BJT). The term "control voltage" therefore refers to the voltage at the control terminal, and therefore to either a gate voltage (e.g., a gate to source VGs) or a base voltage (e.g., a base to emitter voltage (VBE). As described hereinafter, the control voltage is demonstrated as a voltage $V_{GE}$. In response to a deactivation event, such as a desired deactivation of the transistor or a fault condition (e.g., desaturation of the transistor 102 or a short-circuit), the transistor control circuit 104 can be configured to reduce the control voltage $V_{GE}$ to provide a controlled deactivation of the transistor 102. For example, the transistor control circuit 104 can include a current source configured to conduct a current from the control terminal of the transistor 102 to reduce the control voltage $V_{GE}$ at a slew rate. For example, the slew rate can be programmable, such as based on the current source.

The transistor turnoff system 100 also includes a reference comparator 106. The reference comparator 106 is configured to compare the control voltage $V_{GE}$ with a predetermined reference voltage, demonstrated in the example of FIG. 1 as a voltage $V_{REF}$. For example, the reference voltage $V_{REF}$ can be equal to a plateau voltage (e.g., the Miller plateau voltage) of the transistor 102. The reference voltage $V_{REF}$ is shown as being provided externally, but the reference voltage can instead be generated internally as described herein. The reference comparator 106 can be configured to generate a comparison signal provided to the transistor control circuit 104, such as to control the current source of the transistor control circuit 104. For example, the comparison signal can have a first state to activate the transistor control circuit 104 and a second state to deactivate the transistor control circuit 104. Therefore, in response to the control voltage $V_{GE}$ falling below the reference voltage $V_{REF}$, the reference comparator 106 can switch the comparison signal from the first state to the second state to deactivate the transistor control circuit 104, and thus cease deactivation of the transistor 102 at approximately the reference voltage $V_{REF}$, and therefore the plateau voltage amplitude.

As described herein, the phrase "falling below" refers to the control voltage $V_{GE}$ falling to an amplitude at which the reference comparator 106 begins to switch its output state based on a relative amplitude of the control voltage $V_{GE}$ and the reference voltage $V_{REF}$. Also, as described in greater detail herein, the reference voltage $V_{REF}$ is adjustable by a slew-rate adjustment voltage to accommodate an error voltage amplitude that can result from time delays of the reference comparator 106 and/or the transistor control circuit 104. Therefore, as described herein, the comparison of the control voltage $V_{GE}$ with the reference voltage $V_{REF}$ can be the comparison of the control voltage $V_{GE}$ with an adjusted reference voltage that is a sum of the reference voltage $V_{REF}$ and the slew-rate adjustment voltage, as described in greater detail herein.

Figure 2:
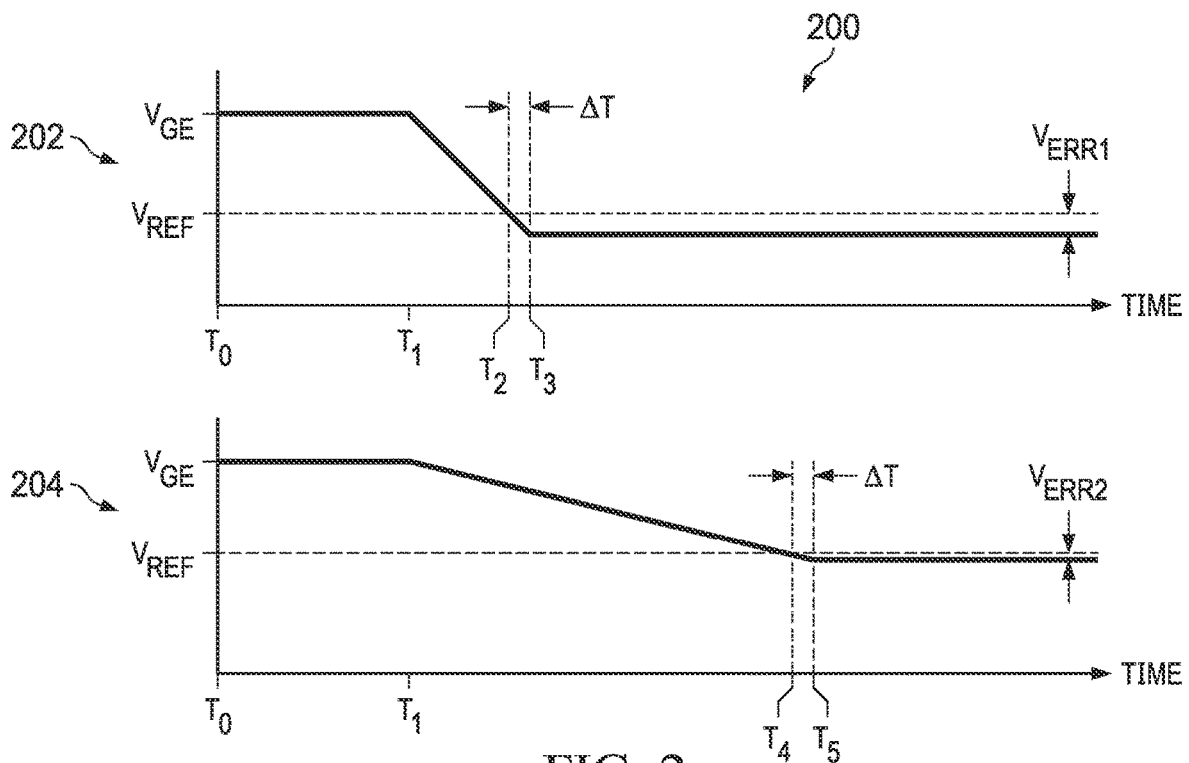
FIG. 2 illustrates an example of a timing diagram.

FIG. 2 illustrates an example of a timing diagram 200. The timing diagram 200 demonstrates a first diagram 202 and a second diagram 204 that plot the control voltage $V_{GE}$ over time. Each of the diagrams 202 and 204 demonstrate the control voltage $V_{GE}$ at a substantially constant amplitude starting at a time $T_0$. For example, the initial amplitude of the control voltage $V_{GE}$ can be a normal operating voltage (e.g., activation voltage) of the transistor 102. Therefore, at the time $T_0$ and thereafter at the constant amplitude of the control voltage $V_{GE}$, the transistor 102 can be activated. At a time $T_1$ in both diagrams 202 and 204, a deactivation event occurs. For example, the deactivation event can represent deactivation of the transistor 102, such as based on a fault condition (e.g., desaturation of the transistor 102 or a short-circuit). Therefore, the transistor control circuit 104 can be activated to reduce the control voltage $V_{GE}$ at a slew rate. In the example of FIG. 2, the first diagram 202 shows a first slew rate, and the second diagram 204 shows a second slew rate below the first slew rate, and therefore decreases at a slower rate than the first slew rate.

In the first diagram 202, the control voltage $V_{GE}$ falls below an approximate amplitude of the reference voltage $V_{REF}$. At a time $T_2$, the control voltage $V_{GE}$ has an amplitude approximately equal to the reference voltage $V_{REF}$ (e.g., falls below the reference voltage $V_{REF}$). Therefore, at the time $T_2$, the reference comparator 106 can change the comparison signal from a first state to a second state to deactivate the transistor control circuit 104. Therefore, the control voltage $V_{GE}$ ceases to decrease at the slew rate. However, the reference comparator 106 and the transistor control circuit 104 can include inherent delays in operation, such as resulting from the switching of transistors therein. Thus, the amplitude of the control voltage $V_{GE}$ continues to decrease after the time $T_2$ until a time $T_3$, at which time the transistor control circuit 104 is deactivated and the amplitude of the control voltage $V_{GE}$ remains constant. Therefore, in the example of FIG. 2, the time delay is demonstrated as a time $\Delta T$, which is a duration of time between the time $T_2$ and the time $T_3$.

Accordingly, due to the time delay of the reference comparator 106 and/or the transistor control circuit 104, despite the reference comparator 106 detecting that the control voltage $V_{GE}$ falls below the reference voltage $V_{REF}$ at the time $T_2$, the transistor control circuit 104 is not deactivated until the time $T_3$. As a result, the control voltage $V_{GE}$ has a constant amplitude below the reference voltage $V_{REF}$. The difference between the constant amplitude of the control voltage $V_{GE}$ after the time $T_3$ and the reference voltage $V_{REF}$ is demonstrated in the example of FIG. 2 as a first error voltage $V_{ERR1}$. As described above, the reference voltage $V_{REF}$ can have an amplitude that is equal to a plateau voltage (e.g., Miller plateau) of the transistor 102. Therefore, because the control voltage $V_{GE}$ has a constant amplitude after the time $T_3$ that is below the reference voltage $V_{REF}$ by the first error amplitude $V_{ERR1}$, the drain or collector voltage of the transistor 102 can increase to an amplitude that can detrimentally damage to the transistor 102.

In the second diagram 204, the control voltage $V_{GE}$ falls below an approximate amplitude of the reference voltage $V_{REF}$ at the second slew rate that is slower than the first slew rate. At a time $T_4$, the control voltage $V_{GE}$ has an amplitude approximately equal to the reference voltage $V_{REF}$ (e.g., falls below the reference voltage $V_{REF}$). Therefore, at the time $T_4$, the reference comparator 106 can change the comparison signal from a first state to a second state to deactivate the transistor control circuit 104. Therefore, the control voltage $V_{GE}$ ceases to decrease at the slew rate. However, similar to as described above, the reference comparator 106 and the transistor control circuit 104 can include the inherent time delay $\Delta T$. Because the time delay $\Delta T$ is associated with the circuit components of the reference comparator 106 and/or the transistor control circuit 104, the time delay $\Delta T$ can be the same regardless of the slew rate. Thus, the amplitude of the control voltage $V_{GE}$ continues to decrease after the time $T_4$ until a time $T_5$, at which time the transistor control circuit 104 is deactivated and the amplitude of the control voltage $V_{GE}$ remains constant.

Accordingly, due to the time delay of the reference comparator 106 and/or the transistor control circuit 104, despite the reference comparator 106 detecting that the control voltage $V_{GE}$ falls below the reference voltage $V_{REF}$ at the time $T_4$, the transistor control circuit 104 is not deactivated until the time $T_5$. As a result, the control voltage $V_{GE}$ has a constant amplitude below the reference voltage $V_{REF}$, similar to as demonstrated in the first diagram 202. However, because the slew rate in the second diagram 204 is less than in the first diagram 202, the difference between the constant amplitude of the control voltage $V_{GE}$ after the time $T_3$ and the reference voltage $V_{REF}$ is demonstrated in the example of FIG. 2 as a second error voltage $V_{ERR2}$ below the first error voltage $V_{ERR1}$. Therefore, the error voltage $V_{ERR}$ can be expressed as a product of the time delay $\Delta T$ and the slew rate of the control voltage $V_{GE}$. Despite the second error voltage $V_{ERR2}$ being below the first error voltage $V_{ERR1}$, the control voltage $V_{GE}$ is still below the reference voltage $V_{REF}$. Thus, the drain or collector voltage of the transistor 102 can still increase to an amplitude that can detrimentally damage to the transistor 102 based on the second error voltage $V_{ERR2}$.

The example of FIG. 2 describes operation of an example transistor turnoff system. For example, the transistor turnoff system can be subject to the control voltage $V_{GE}$ achieving a constant amplitude below the reference voltage $V_{REF}$, and thus causing potential damage to the transistor 102. However, as described in greater detail herein, the transistor turnoff system 100 can add a slew-rate adjustment voltage to the reference voltage $V_{REF}$ to provide an adjusted reference voltage. As a result, the comparison of the control voltage $V_{GE}$ with the slew-rate adjustment voltage Referring again to the example of FIG. 1, the transistor turnoff system 100 further includes a slew-rate compensator 108. The slew-rate compensator 108 is configured to generate a slew-rate adjustment voltage, described hereinafter as a voltage $V_{SR}$, which is proportional to the slew rate of the decrease of the control voltage $V_{GE}$, and is further configured to add the slew-rate adjustment voltage to the reference voltage $V_{REF}$. Therefore, the reference comparator 106 can compare the control voltage $V_{GE}$ with the adjusted reference voltage, described hereinafter as a voltage $V_{ADJ}$. As a result, the reference comparator 106 can compensate for the time delay $\Delta T$ of the reference comparator 106 and/or the transistor control circuit 104 in providing the comparison of the control voltage $V_{GE}$ with the adjusted reference voltage $V_{ADJ}$. As a result, after expiration of the time delay $\Delta T$, the control voltage $V_{GE}$ can have a substantially constant amplitude approximately equal to the reference voltage $V_{REF}$, regardless of the slew rate of the decrease of the control voltage $V_{GE}$ before deactivation of the transistor control circuit 104. Accordingly, the error voltage $V_{ERR}$ can be set to approximately zero, thus mitigating the potential for an undesirable increase in the drain or collector voltage during the constant amplitude of the control voltage $V_{GE}$.

Figure 3:
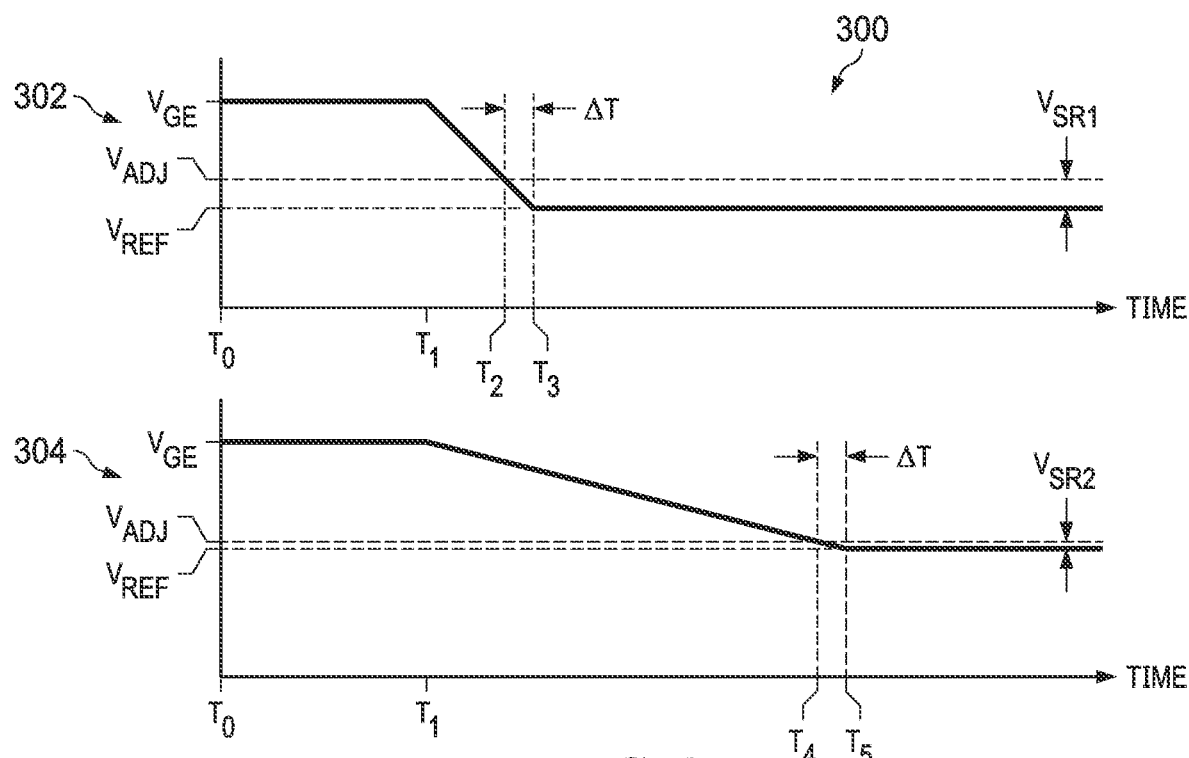
FIG. 3 illustrates another example of a timing diagram.

FIG. 3 illustrates an example of a timing diagram 300. The timing diagram 300 demonstrates a first diagram 302 and a second diagram 304 that plot the control voltage $V_{GE}$ over time. The timing diagram 300 demonstrates the effect of the comparison of the control voltage $V_{GE}$ with the adjusted reference voltage $V_{ADJ}$ by the reference comparator 106, as described above.

Each of the diagrams 302 and 304 demonstrate the control voltage $V_{GE}$ at a substantially constant amplitude starting at a time $T_0$. For example, the initial amplitude of the control voltage $V_{GE}$ can be a normal operating voltage (e.g., activation voltage) of the transistor 102. Therefore, at the time $T_0$ and thereafter at the constant amplitude of the control voltage $V_{GE}$, the transistor 102 can be activated. At a time $T_1$ in both diagrams 302 and 304, a deactivation event occurs. For example, the deactivation event can represent deactivation of the transistor 102, such as based on a fault condition (e.g., desaturation of the transistor 102 or a short-circuit). Therefore, the transistor control circuit 104 can be activated to decrease the control voltage $V_{GE}$ at a slew rate. In the example of FIG. 3, the first diagram 302 shows a first slew rate, and the second diagram 304 shows a second slew rate below the first slew rate, and therefore decreases at a slower rate than the first slew rate.

In the example of the first diagram 302, the slew-rate compensator 108 can generate a slew-rate adjustment voltage $V_{SR1}$ proportional to the first slew rate. For example, the slew-rate adjustment voltage $V_{SR1}$ can be approximately equal to the first error voltage $V_{ERR1}$ in the example of FIG. 2. The slew-rate compensator 108 can thus add the slew-rate adjustment voltage $V_{SR1}$ to the reference voltage $V_{REF}$ to provide an adjusted reference voltage $V_{ADJ}$ to which the reference comparator 106 can compare the control voltage $V_{GE}$. Therefore, the control voltage $V_{GE}$ falls below an approximate amplitude of the adjusted reference voltage $V_{ADJ}$. At a time $T_2$, the control voltage $V_{GE}$ has an amplitude approximately equal to the adjusted reference voltage $V_{ADJ}$ (e.g., falls below the adjusted reference voltage $V_{ADJ}$). Therefore, at the time $T_2$, the reference comparator 106 can change the comparison signal from a first state to a second state to deactivate the transistor control circuit 104. Therefore, the control voltage $V_{GE}$ ceases to decrease at the slew rate. However, the amplitude of the control voltage $V_{GE}$ continues to decrease after the time $T_2$ until a time $T_3$, at which time the transistor control circuit 104 is deactivated and the amplitude of the control voltage $V_{GE}$ remains constant, based on the time delay $\Delta T$.

Accordingly, due to the time delay of the reference comparator 106 and/or the transistor control circuit 104, upon the reference comparator 106 detecting that the control voltage $V_{GE}$ falls below the adjusted reference voltage $V_{ADJ}$ at the time $T_2$, the transistor control circuit 104 is not deactivated until the time $T_3$. At the time $T_3$, the control voltage $V_{GE}$ has a constant amplitude that approximately equal to the reference voltage $V_{REF}$. As a result, there is no error voltage amplitude of the control voltage $V_{GE}$ after the time $T_3$, and the reference voltage $V_{REF}$ has an amplitude that is equal to the plateau voltage (e.g., Miller plateau) of the transistor 102. Accordingly, an increase in the drain or collector voltage of the transistor 102 can be mitigated, so potential damage to the transistor 102 can likewise be mitigated.

In the second diagram 304, the slew-rate compensator 108 can generate a slew-rate adjustment voltage $V_{SR2}$ proportional to the second slew rate. For example, the slew-rate adjustment voltage $V_{SR2}$ can be approximately equal to the second error voltage $V_{ERR2}$ in the example of FIG. 2. The slew-rate compensator 108 can thus add the slew-rate adjustment voltage $V_{SR2}$ to the reference voltage $V_{REF}$ to provide an adjusted reference voltage $V_{ADJ}$ to which the reference comparator 106 can compare the control voltage $V_{GE}$. Therefore, the control voltage $V_{GE}$ falls below an approximate amplitude of the adjusted reference voltage $V_{ADJ}$ at the second slew rate that is slower than the first slew rate. At a time $T_4$, the control voltage $V_{GE}$ has an amplitude approximately equal to the adjusted reference voltage $V_{ADJ}$ (e.g., falls below the adjusted reference voltage $V_{ADJ}$). Therefore, at the time $T_4$, the reference comparator 106 can change the comparison signal from a first state to a second state to deactivate the transistor control circuit 104. Therefore, the control voltage $V_{GE}$ ceases to decrease at the slew rate. However, similar to as described above, the amplitude of the control voltage $V_{GE}$ continues to decrease after the time $T_4$ until a time $T_5$, at which time the transistor control circuit 104 is deactivated and the amplitude of the control voltage $V_{GE}$ remains constant, based on the time delay $\Delta T$.

Accordingly, due to the time delay of the reference comparator 106 and/or the transistor control circuit 104, upon the reference comparator 106 detecting that the control voltage $V_{GE}$ falls below the adjusted reference voltage $V_{ADJ}$ at the time $T_4$, the transistor control circuit 104 is not deactivated until the time $T_5$. At the time $T_5$, the control voltage $V_{GE}$ has a constant amplitude that approximately equal to the reference voltage $V_{REF}$. As a result, there is no error voltage amplitude of the control voltage $V_{GE}$ after the time $T_5$, and the reference voltage $V_{REF}$ has an amplitude that is equal to the plateau voltage (e.g., Miller plateau) of the transistor 102. Accordingly, similar to as described in the first diagram 302, an increase in the drain or collector voltage of the transistor 102 can be mitigated, so potential damage to the transistor 102 can likewise be mitigated. Also, as demonstrated in the example of FIG. 3 herein, the slew-rate compensator 108 can generate the slew-rate adjustment voltage $V_{SR}$ to have an amplitude proportional to the slew rate, and thus provides for the control voltage $V_{GE}$ to be set to the constant amplitude approximately equal to the reference voltage $V_{REF}$, regardless of the slew rate.

Figure 4:
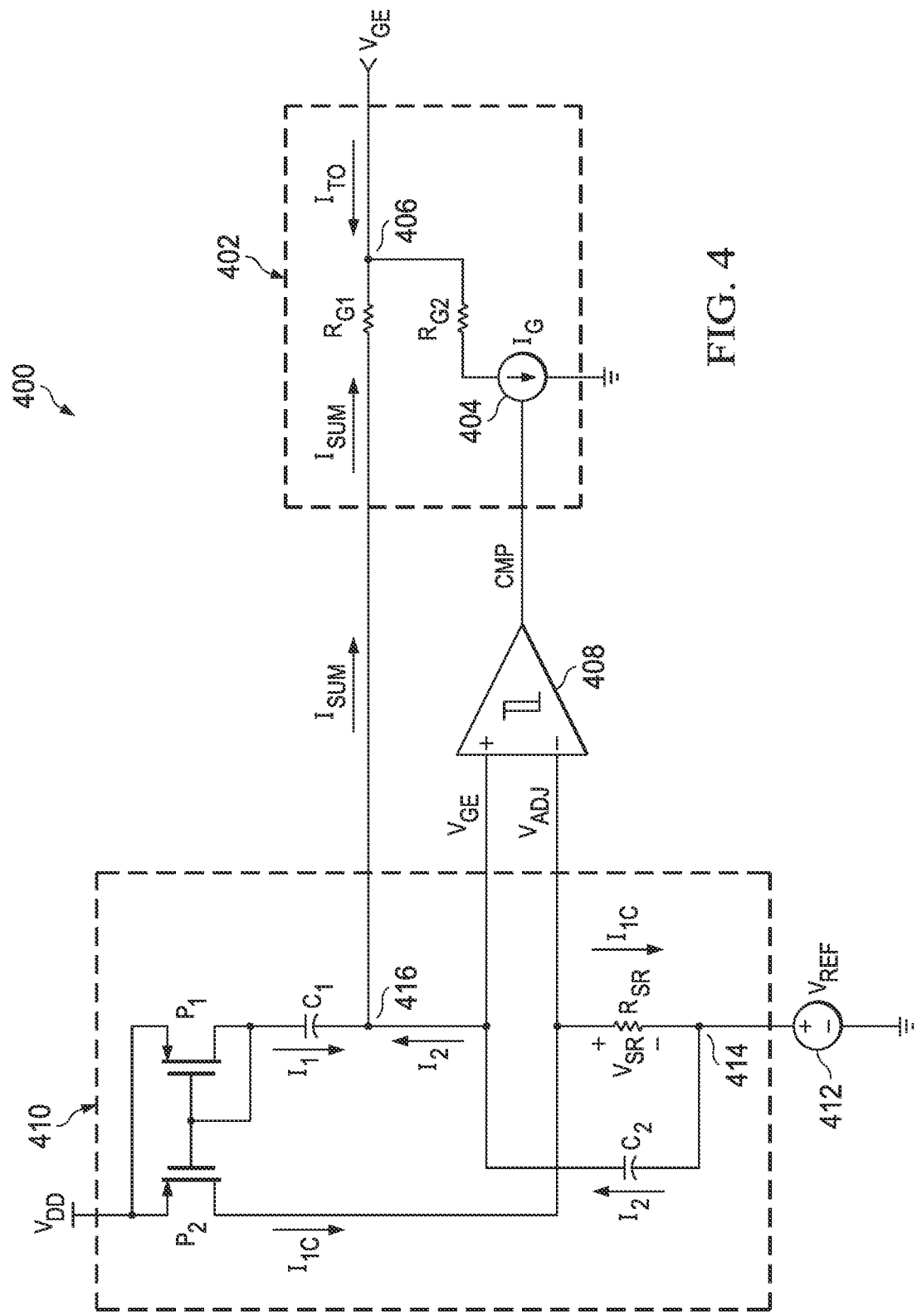
FIG. 4 illustrates an example of a transistor turnoff circuit.

FIG. 4 illustrates an example of a transistor control circuit 400. The transistor control circuit 400 can be implemented in any of a variety of high-voltage switching systems to provide for a controlled deactivation of a transistor (not shown in the example of FIG. 4), such as the transistor 102 of FIG. 1. For example, the transistor control circuit 400 can be implemented for motor controls, such as in an electric vehicle. As another example, the transistor control circuit 400 can be part of an integrated circuit (IC), and the transistor can be an external device electrically coupled to the transistor control circuit 400 via external pins with respect to the IC.

The transistor control circuit 400 includes a transistor control circuit 402. The transistor control circuit 402 includes a current source 404 configured to conduct a current $I_G$ in response to a comparison signal CMP. The transistor control circuit 402 also includes a first resistor $R_{G1}$ and a second resistor $R_{G2}$, which are each coupled to a terminal 406 that represents the control terminal of the transistor, and which has the control voltage $V_{GE}$. Therefore, in response to activation via the comparison signal CMP (e.g., a first state of the comparison signal CMP), such as based on a deactivation event, the current source 404 conducts the current $I_G$ from the terminal 406 via the resistor $R_{G2}$ to reduce the amplitude of the control voltage $V_{GE}$. In the example of FIG. 4, the current $I_G$ can be expressed as a sum of a turnoff current $I_{TO}$ provided from the control terminal of the transistor and a current $I_{SUM}$. For example, the current $I_{TO}$ can be greater than the current $I_{SUM}$ (e.g., by several orders of magnitude). For example, the current $I_{SUM}$ can have a relatively small amplitude (e.g., below 5 µA, such as 3 µA) relative to the turnoff current (e.g., between 300 mA and 1.2 A). Because the current $I_G$ is expressed as a sum of the current $I_{SUM}$ and the turnoff current $I_{TO}$, the current $I_G$ can have an amplitude that defines the slew rate of the decrease of the control current $V_{GE}$.

The transistor control circuit 400 also includes a reference comparator 408. The reference comparator 408 is configured to compare the control voltage $V_{GE}$ at a non-inverting input via the resistor $R_{G1}$ with an adjusted reference voltage $V_{ADJ}$ at the inverting input. The adjusted reference voltage $V_{ADJ}$ equals a sum of the reference voltage $V_{REF}$ and the slew-rate adjustment voltage $V_{SR}$, as described above. For example, the reference voltage $V_{REF}$ can be equal to a plateau voltage (e.g., the Miller plateau voltage) of the transistor. The reference comparator 408 is demonstrated as generating the comparison signal CMP provided to the current source 404 of the transistor control circuit 402. For example, the first state of the comparison signal CMP can activate the current source 404, and a second state can deactivate the current source 404. Therefore, in response to the control voltage $V_{GE}$ falling below the adjusted reference voltage $V_{ADJ}$, the reference comparator 408 can switch the comparison signal from the first state to the second state to deactivate the current source 404, and thus cease deactivation of the transistor at approximately the reference voltage $V_{REF}$, and therefore the plateau voltage amplitude, as described herein.

The transistor control circuit 400 further includes a slew-rate compensator 410. The slew-rate compensator 410 includes a voltage source 412 configured to generate the reference voltage $V_{REF}$, and further includes a resistor $R_{SR}$ interconnecting the inverting input of the reference comparator 408 and a terminal 414 coupled to the voltage source 412. As described in greater detail herein, in response to the decrease of the control voltage $V_{GE}$, the resistor $R_{SR}$ can exhibit the slew-rate adjustment voltage $V_{SR}$ across it, so the slew-rate adjustment voltage $V_{SR}$ is added to the reference voltage $V_{REF}$ to provide the adjusted reference voltage $V_{ADJ}$ at the inverting input of the reference comparator 408.

The slew-rate compensator 410 also includes a first P-channel FET (hereinafter "PFET") $P_1$ and a second PFET $P_2$ configured to conduct a current from a high-voltage rail, demonstrated as a voltage $V_{DD}$. In the example of FIG. 4, the PFETs $P_1$ and $P_2$ can be sized approximately the same, and are arranged with common sources and common gates, and are therefore arranged as a current-mirror. Particularly, in the example of FIG. 4, in response to activation of the current source 404 during the deactivation event, the current $I_G$ draws the current $I_{SUM}$ through the resistor $R_{G1}$ (e.g., as the sum of the current $I_G$ and the turnoff current $I_{TO}$, as described above). The current $I_{SUM}$ equals a sum of a current $I_1$ and a current $I_2$ that are combined at a terminal 416. In the example of FIG. 4, the current $I_1$ flows through a capacitor $C_1$ and the current $I_2$ flows through a capacitor $C_2$. For example, the capacitors $C_1$ and $C_2$ can be sized approximately equally, so the currents $I_1$ and $I_2$ can be equal and can form respective halves of the current $I_{SUM}$.

For example, in response to the deactivation event, the current source 404 is activated to conduct the current $I_G$, resulting in the flow of the current $I_{SUM}$ and thus the decrease of the control voltage $V_{GE}$. As a result, the current $I_1$ flows from the high-voltage rail $V_{DD}$ through the PFET $P_1$ and the capacitor $C_1$. The current $I_1$ can thus have an amplitude that can be expressed as follows:

$$I_1 = C_1 * dV_{GE}/dt \qquad \text{Equation 1}$$

where $dV_{GE}/dt$ is the change in amplitude of the control voltage $V_{GE}$, and thus the slew rate of the control voltage.

Because the PFETs $P_1$ and $P_2$ are arranged as approximately equal sized transistors in a current-mirror configuration, the PFET $P_2$ is demonstrated in the example of FIG. 4 as conducting a current $I_{1C}$ that has an amplitude approximately equal to the amplitude of the current $I_1$. The current $I_{1C}$ is demonstrated as flowing through the resistor $R_{SR}$ to provide the slew-rate adjustment voltage $V_{SR}$ across the resistor $R_{SR}$. As a result, the slew-rate adjustment voltage $V_{SR}$ has an amplitude that can be expressed as follows:

$$V_{SR} = I_{1C} * R_{SR} = R_{SR} * C_1 * dV_{GE}/dt \qquad \text{Equation 2}$$

Because the slew-rate adjustment voltage $V_{SR}$ is a factor of the change of amplitude of the control voltage $V_{GE}$ over time, and thus the slew rate, the slew-rate adjustment voltage $V_{SR}$ is proportional to the slew rate. For example, the capacitors $C_1$ and $C_2$ can be designed for the slew-rate adjustment voltage $V_{SR}$ to approximately equal the error voltage $V_{ERR}$ of example transistor control circuits, as described in the example of FIG. 2. For example, the error voltage $V_{ERR}$ can be described as follows:

$$V_{ERR} = dV_{GE}/dt * \Delta T \qquad \text{Equation 3}$$

Substituting Equations 1 and 2, results in the following:

$$V_{SR} = R_{SR} * I_1 = R_{SR} * C_1 * dV_{GE}/dt \qquad \text{Equation 4}$$

Setting $V_{SR}$ equal to $V_{ERR}$ results in the following:

$$V_{SR} = R_{SR} * C_1 * dV_{GE}/dt = dV_{GE}/dt * \Delta T = V_{ERR} \qquad \text{Equation 5}$$

Accordingly, Equation 5 can allow for $C_1$ to be calculated as follows:

$$C_1 = \Delta T / R_{SR} \qquad \text{Equation 6}$$

As a result, by sizing the capacitors $C_1$ and $C_2$ to be approximately equal based on Equation 6, the slew-rate adjustment voltage $V_{SR}$ can be set approximately equal to the error voltage $V_{ERR}$, which can allow the substantially constant amplitude of the control voltage $V_{GE}$, upon deactivation of the current source 404 in response to the second state of the comparison signal CMP, to be approximately equal to the reference voltage $V_{REF}$, as described in the example of FIG. 3.

As described above, the capacitor $C_2$ is configured to conduct the current $I_2$ to the terminal 416. In the example of FIG. 2, the current $I_2$ flows from the terminal 414 and can be approximately equal to the current $I_{1C}$, as described above. For example, the voltage source 412 that generates the reference voltage $V_{REF}$ can be a non-ideal voltage reference with an internal resistance. Therefore, the current $I_{1C}$ can flow through the resistor $R_{SR}$, and substantially the entirety of the amplitude of the current $I_{1C}$ can flow from the terminal 414 as the current $I_2$ through the capacitor $C_2$ to maintain stability in the reference voltage $V_{REF}$. As a result, without the current $I_2$ flowing from the terminal 414 through the capacitor $C_2$ as substantially the entirety of the voltage $I_{1C}$, the accuracy of the voltage source 412, and thus the amplitude of the reference voltage $V_{REF}$, can be compromised (e.g., through AC noise). The currents $I_1$ and $I_2$ are thus combined at the terminal 416 to form the current $I_{SUM}$, which flows through the resistor $R_{G1}$, and is thus combined with the turnoff current $I_{TO}$ through the resistor $R_{G2}$ to provide the current $I_G$ during activation of the current source 404. Accordingly, the current $I_{1C}$ can generate the amplitude of the slew-rate adjustment voltage $V_{SR}$ through the resistor $R_{SR}$ without affecting the amplitude of the reference voltage $V_{REF}$.

Figure 5:
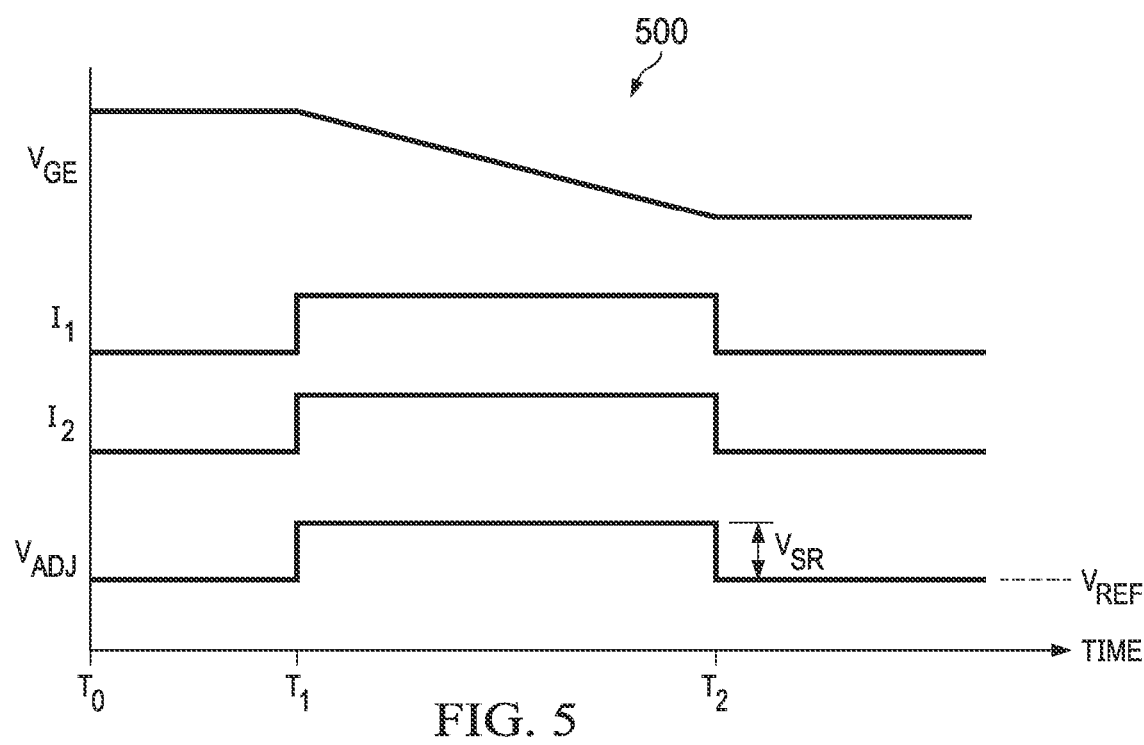
FIG. 5 illustrates another example of a timing diagram.

FIG. 5 illustrates another example of a timing diagram 500. The timing diagram 500 includes the control voltage $V_{GE}$, the current $I_1$, the current $I_2$, and the adjusted reference voltage $V_{ADJ}$ plotted as a function of time. The timing diagram 500 can show operation of the transistor control circuit 400. Therefore, the example of FIG. 4 likewise relates to the following description of the example of FIG. 5.

The timing diagram 500 demonstrates the control voltage $V_{GE}$ at a substantially constant amplitude starting at a time $T_0$. For example, the initial amplitude of the control voltage $V_{GE}$ can be a normal operating voltage (e.g., activation voltage) of the transistor (e.g., the transistor 102). Therefore, at the time $T_0$ and thereafter at the constant amplitude of the control voltage $V_{GE}$, the transistor can be activated. At a time $T_1$, a deactivation event occurs. For example, the deactivation event can represent deactivation of the transistor, such as based on a fault condition (e.g., desaturation of the transistor or a short-circuit). Therefore, the current source 404 can be activated to conduct the current $I_G$, and thus to reduce the control voltage $V_{GE}$ at a slew rate. In response to the current $I_G$, the current $I_{SUM}$ likewise flows. As described in the example of FIG. 4, the current $I_{SUM}$ includes the currents $I_1$ and $I_2$ flowing through the respective capacitors $C_1$ and $C_2$. Therefore, the timing diagram 500 demonstrates activation of the currents $I_1$ and $I_2$ at the time $T_1$.

Before the time $T_1$, the adjusted reference voltage $V_{ADJ}$ has an amplitude approximately equal to the reference voltage $V_{REF}$, as generated by the voltage source 412. Before the time $T_1$, the current $I_1$ is approximately equal to zero. Therefore, the current $I_{1C}$ is not generated via the current mirror configuration of the PFETs $P_1$ and $P_2$. Because the current $I_{1C}$ does not flow through the resistor $R_{SR}$, the slew-rate adjustment voltage $V_{SR}$ has an amplitude of approximately zero. Therefore, the adjusted reference voltage $V_{ADJ}$ is approximately equal to the reference voltage $V_{REF}$ before the time $T_1$. However, at the time $T_1$, in response to the flow of the current $I_1$, the current $I_{1C}$ is generated via the current mirror configuration of the PFETs $P_1$ and $P_2$. The current $I_{1C}$ thus flows through the resistor $R_{SR}$, thereby increasing the slew-rate adjustment voltage $V_{SR}$ to an amplitude proportional to the slew rate, and thus approximately equal to the error voltage $V_{ERR}$, as described in the example of FIGS. 2 and 3 and based on Equations 3-6. As a result, the amplitude of the slew-rate adjustment voltage $V_{SR}$ is added to the amplitude of the reference voltage $V_{REF}$ to form the adjusted reference voltage $V_{ADJ}$ at the inverting input of the reference comparator 408 at the time $T_1$. Also, as the current $I_{1C}$ flows through the resistor $R_{SR}$, the current $I_2$ flows from the terminal 414, approximately equal to the current $I_{1C}$, to be combined with the current $I_1$ at the terminal 416 to form the current $I_{SUM}$.

The control voltage $V_{GE}$ continues to reduce after the time $T_1$ at the slew rate until a time $T_2$. Thus, as the control voltage $V_{GE}$ decreases, the currents $I_1$ and $I_2$ continue to flow through the respective capacitors $C_1$ and $C_2$ to form the current $I_{SUM}$ to provide the current flow $I_G$ from the control terminal of the transistor (via the resistors $R_{G1}$ and $R_{G2}$). At the time $T_2$, the reference comparator 408 can determine that the control voltage $V_{GE}$ falls below the adjusted reference voltage $V_{ADJ}$, and therefore changes the state of the comparison signal CMP to the second state to deactivate the current source 404. As a result, the current $I_G$ decreases to zero, thereby reducing the control voltage $V_{GE}$ to approximately the reference voltage $V_{REF}$ after the time delay $\Delta T$, as described above in the example of FIGS. 3 and 4. Also, the current $I_G$ falling to approximately zero likewise causes the currents $I_1$ and $I_2$ to fall to approximately zero. As a result, the current $I_{1C}$ falls to approximately zero, which likewise causes the slew-rate adjustment voltage $V_{SR}$ to fall to approximately zero. Accordingly, the adjusted reference voltage $V_{ADJ}$ falls to the approximate amplitude of the reference voltage $V_{REF}$ at the time $T_2$.

Modifications are possible in the described embodiments, and other embodiments are possible, within the scope of the claims.

What is claimed is:

1. A circuit comprising:
   a first transistor having first and second current terminals and a first control terminal, wherein the first current terminal is coupled to a power supply terminal;
   a second transistor having third and fourth current terminals and a second control terminal, wherein the third current terminal is coupled to the power supply terminal, and the second control terminal is coupled to the first control terminal and to the fourth current terminal;
   a comparator having first and second comparator inputs and a comparator output, wherein the first comparator input is coupled to the fourth current terminal, and the second comparator input is coupled to the second current terminal;
   a resistor having first and second resistor terminals, wherein the first resistor terminal is coupled to the second comparator input; and
   a reference voltage source coupled between the second resistor terminal and a ground terminal, wherein the reference voltage source provides a reference voltage.

2. The circuit of claim 1, wherein the first transistor and the second transistor form a current mirror.

3. The circuit of claim 1, further comprising a capacitor coupled between the fourth current terminal and the first comparator input.

4. The circuit of claim 3, wherein the capacitor is a first capacitor, and the circuit is further comprising a second capacitor coupled between the first comparator input and the second resistor terminal.

5. The circuit of claim 4, wherein the reference voltage is increased by a compensation voltage.

6. The circuit of claim 5, wherein the compensation voltage compensates for a time delay of the comparator, and the compensation voltage is proportional to a slew rate of a control voltage signal.

7. A system comprising:
   a first transistor having first and second current terminals and a first control terminal, wherein the first current terminal is coupled to a power supply terminal;
   a second transistor having third and fourth current terminals and a second control terminal, wherein the third current terminal is coupled to the power supply terminal, and the second control terminal is coupled to the first control terminal and to the fourth current terminal;
   a third transistor having a third control terminal;
   a transistor control circuit having a transistor control input and a transistor control output, wherein the transistor control output is coupled to the third control terminal, and the transistor control circuit is configured to provide a transistor control signal at the transistor control output;
   a comparator having first and second comparator inputs and a comparator output, wherein the first comparator input is coupled to the fourth current terminal, the second comparator input is coupled to the second current terminal, and the comparator output is coupled to the transistor control input;
   a resistor having first and second resistor terminals, wherein the first resistor terminal is coupled to the second comparator input; and
   a reference voltage source coupled between the second resistor terminal and a ground terminal, wherein the reference voltage source provides a reference voltage.

8. The system of claim 7, wherein the first transistor and the second transistor form a current mirror.

9. The system of claim 7, further comprising a capacitor coupled between the fourth current terminal and the first comparator input.

10. The system of claim 9, wherein the capacitor is a first capacitor, and the system is further comprising a second capacitor coupled between the first comparator input and the second resistor terminal.

11. The system of claim 10, wherein the reference voltage is increased by a compensation voltage.

12. The system of claim 11, wherein the compensation voltage compensates for a time delay of the comparator or the transistor control circuit, and the compensation voltage is proportional to a slew rate of the transistor control signal.

13. The system of claim 7, wherein the transistor control circuit includes a current source having a current source output coupled to the transistor control output, wherein the current source is configured to provide a current at the current source output responsive to a voltage at the comparator output.

14. The system of claim 7, wherein the reference voltage is a plateau voltage of the third transistor.

* * * * *